United States Patent [19]
Saito et al.

[11] Patent Number: 5,304,954
[45] Date of Patent: Apr. 19, 1994

[54] PLL SYNTHESIZER HAVING FREQUENCY DIVIDERS WITH RESET CONTROL

[75] Inventors: Shinji Saito; Akira Kobayashi, both of Kasugai, Japan

[73] Assignee: Fujitsu Limited, Kasugai, Japan

[21] Appl. No.: 89,644

[22] Filed: Jul. 12, 1993

Related U.S. Application Data

[63] Continuation of Ser. No. 925,768, Aug. 7, 1992, abandoned.

[30] Foreign Application Priority Data

Aug. 8, 1991 [JP] Japan .................. 03-199182

[51] Int. Cl.$^5$ .................. H03L 7/089; H03L 7/095; H03L 7/18
[52] U.S. Cl. .................. 331/1 A; 331/14; 331/16; 331/25; 331/DIG. 2
[58] Field of Search .................. 331/1 A, 14, 16, 25, 331/DIG. 2

[56] References Cited

U.S. PATENT DOCUMENTS 4,817,199  3/1989  Wallraff .................. 331/55 X
5,113,152  5/1992  Norimatsu .................. 331/16 X

FOREIGN PATENT DOCUMENTS 6446319  2/1989  Japan .

Primary Examiner—Siegfried H. Grimm
Attorney, Agent, or Firm—Staas & Halsey

[57] ABSTRACT

This invention aims at providing a PLL synthesizer circuit that can shorten lock-up time while sufficiently securing a time constant of a low-pass filter, and has a structure wherein a phase comparator 3 outputs output signals φR and φP on the basis of a reference signal fr output from a reference frequency divider 2, and a comparison signal fp output from a comparison frequency divider 4; the output signals φR and φP are negatively fed back to the comparison frequency divider 4 through a charge pump 5, a low-pass filter 6 and a voltage controlled oscillator 7, and a lock detection circuit 8 outputs a lock signal LD when in a locked state. When an output signal SVCO of the voltage control oscillator 7 coincides with a set frequency, when the lock detection circuit 8 does not output the lock signal LD, a reset circuit 15 outputs a reset signal PC to the reference frequency divider 2 and to the comparison frequency divider 4, and the reset signal PC brings the phase of the reference signal fr into conformity with the phase of the comparison signal fp.

5 Claims, 8 Drawing Sheets

PLL SYNTHESIZER HAVING FREQUENCY DIVIDERS WITH RESET CONTROL

This application is a continuation of U.S. Pat. application Ser. No. 07/925,768, filed Aug. 7, 1992, now abandoned.

BACKGROUND OF THE INVENTION

1. Field of the Invention

This invention relates to a PLL synthesizer circuit that operates so as to always bring an output signal frequency into conformity with a set frequency.

2. Description of the Related Art

A PLL synthesizer circuit is a negative feedback circuit that operates so as to bring a set frequency into conformity with an output signal frequency. Recently, the PLL synthesizer circuit has been used for automobile telephones, portable telephones, etc., and the time necessary to fix an output signal frequency to a set frequency must be shortened in order to reduce access time of the PLL synthesizer circuit.

An example of conventional PLL synthesizer circuits will be explained with reference to FIGS. 6 and 7 of the accompanying drawings. A quartz oscillator 1 outputs a reference clock signal CK of a natural frequency based on the oscillation of a quartz oscillation element to a reference frequency divider 2, and this reference frequency divider 2 divides the frequency of the reference clock signal CK on the basis of a set frequency, which is set from outside, and outputs a reference signal fr to a phase comparator 3. A comparison frequency divider 4 outputs a comparison signal fp to the phase comparator 3. The phase comparator 3 compares the reference signal fr with the comparison signal fp, and outputs pulse signals $\phi R$ and $\phi P$ corresponding to their frequency difference and their phase difference, respectively, to a charge pump 5.

The charge pump 5 outputs an output signal SCP on the basis of the pulse signals $\phi R$, $\phi P$ output from the phase comparator 5, to a low-pass filter (hereinafter referred to as "LPF") 6. This output signal SCP contains a pulse component in its D.C. component. The D.C. component rises and falls with the frequency changes of the pulse signals $\phi R$, $\phi P$, while the pulse component changes on the basis of the phase difference of the pulse signals $\phi R$, $\phi P$.

The LPF 6 smoothes the output signal SCP of the charge pump 5, and outputs an output signal SLPF, from which a radio frequency (RF) component is removed, to a voltage controlled oscillator (hereinafter referred to as "VCO") 7. The VCO 7 outputs an output signal SVCO having a frequency corresponding to the voltage value of the output signal SLPF of the LPF 6 to an outside circuit and to the comparison frequency divider 4 described above. The comparison frequency divider 4 divides the frequency of the output signal SVCO of the VCO 7 and outputs it to the phase comparator 3.

The pulse signal $\phi R$ output from the phase comparator 3 is output as a pulse signal $f\Delta$ to a lock detection circuit 8. This lock detection circuit 8 outputs a lock signal LD when a pulse width of the pulse signal $f\Delta$ is below a predetermined value or when the pulse signal $f\Delta$ is not output. When the output signal SVCO of the VCO 7 changes and the pulse width of the pulse signal $f\Delta$ is above a predetermined value, the lock detection circuit 8 outputs an unlock signal ULD at an L level.

In the PLL synthesizer circuit having the circuit construction as described above, when a setting of the comparison signal fp, for example, is changed and its frequency is lowered from the lock state where the frequency and phase of the reference signal fr are in conformity with those of the comparison signal fp, differences occur in the frequencies and phases of the reference signal fr and the comparison signal fp as shown in FIG. 7, and then, the phase comparator 3 outputs the pulse signals $\phi R$ and $\phi P$, and the unlock signal ULD at an L level is output. The D.C. component of the output signal SCP of the charge pump 5 changes and the pulse component develops. The voltage level of the output signal SLPF of the LPF 6 rises on the basis of the output signal SCP, and the output signal SLPF of the LPF 6 converges to a voltage level corresponding to the comparison signal fp set afresh, and the operation mode returns to the lock state.

When the frequency of the comparison signal fp of the PLL synthesizer circuit is lowered as described above, the output signal SLPF of the LPF 6 rises from V1 to V2 as indicated by a solid line in FIG. 8, for example. However, since the phase difference occurs even when the frequency of the reference signal fr is in conformity with that of the comparison signal fp, the output signal SLPF, which has risen to a point near V2, converges with V2 while repeating an over-shoot and under-shoot. Accordingly, there remains the problem that the lock-up time from the change of setting of the comparison signal fp to the rise and conversion of the output signal SLPF from V1 to V2 is long. On the other hand, the lock-up time can be shortened by reducing the time constant of the LPF 6 to reduce an over-shoot and under-shoot, but when the time constant of the LPF 6 is reduced, the pulse component contained in the output signal SCP of the charge pump 5 cannot be sufficiently eliminated, so that the frequency of the output signal SVCO of the VCO 7 becomes unstable.

SUMMARY OF THE INVENTION

It is an object of the present invention to provide a PLL synthesizer circuit that can shorten the lock-up time while sufficiently securing the time constant of the LPF.

To accomplish the object described above, the present invention employs the technical structure shown in an explanatory view of FIG. 1. The reference signal fr output from the reference frequency divider 2 and the comparison signal fp output from the comparison frequency divider 4 are input to the phase comparator 3, and the phase comparator 3 outputs the output signals $\phi R$ and $\phi P$; the pulse widths of which change on the basis of the phase difference between both signals fr and fp. The output signals $\phi R$ and $\phi P$ of the phase comparator 3 are converted to an analog voltage signal SCP by the charge pump 5, and the output signal SCP of the charge pump 5 is output to the voltage controlled oscillator 7 through the low-pass filter 6. The output signal SVCO of the voltage controlled oscillator 7 is output to the comparison frequency divider 4 and a negative feedback operation is conducted so as to bring the frequency and phase of the reference signal fr into conformity with those of the comparison signal fp. The lock detection circuit 8 does not output the lock signal LD when the pulse widths of the output signals $\phi R$ and $\phi P$ of the phase comparator 3 are the above predetermined values, but outputs the lock signal LD when they are below the predetermined values. In this way, the PLL synthesizer circuit of the present invention is constituted. Furthermore, the PLL synthesizer circuit includes a reset circuit 15 that outputs a reset signal PC when the frequency of the output signal SVCO of the voltage controlled oscillator 7, when the lock detection circuit 8 does not output the lock signal LD, is in conformity with or approaches the set frequency. The reset signal PC is output to the reference frequency divider 2 and to the comparison frequency divider 4 so as to compulsively bring the phase of the reference signal fr into conformity with the phase of the comparison signal fp.

DESCRIPTION OF THE PREFERRED EMBODIMENTS

Hereinafter, definite examples of a PLL synthesizer circuit according to the present invention will be explained in detail with reference to the accompanying drawings.

Figure 1:
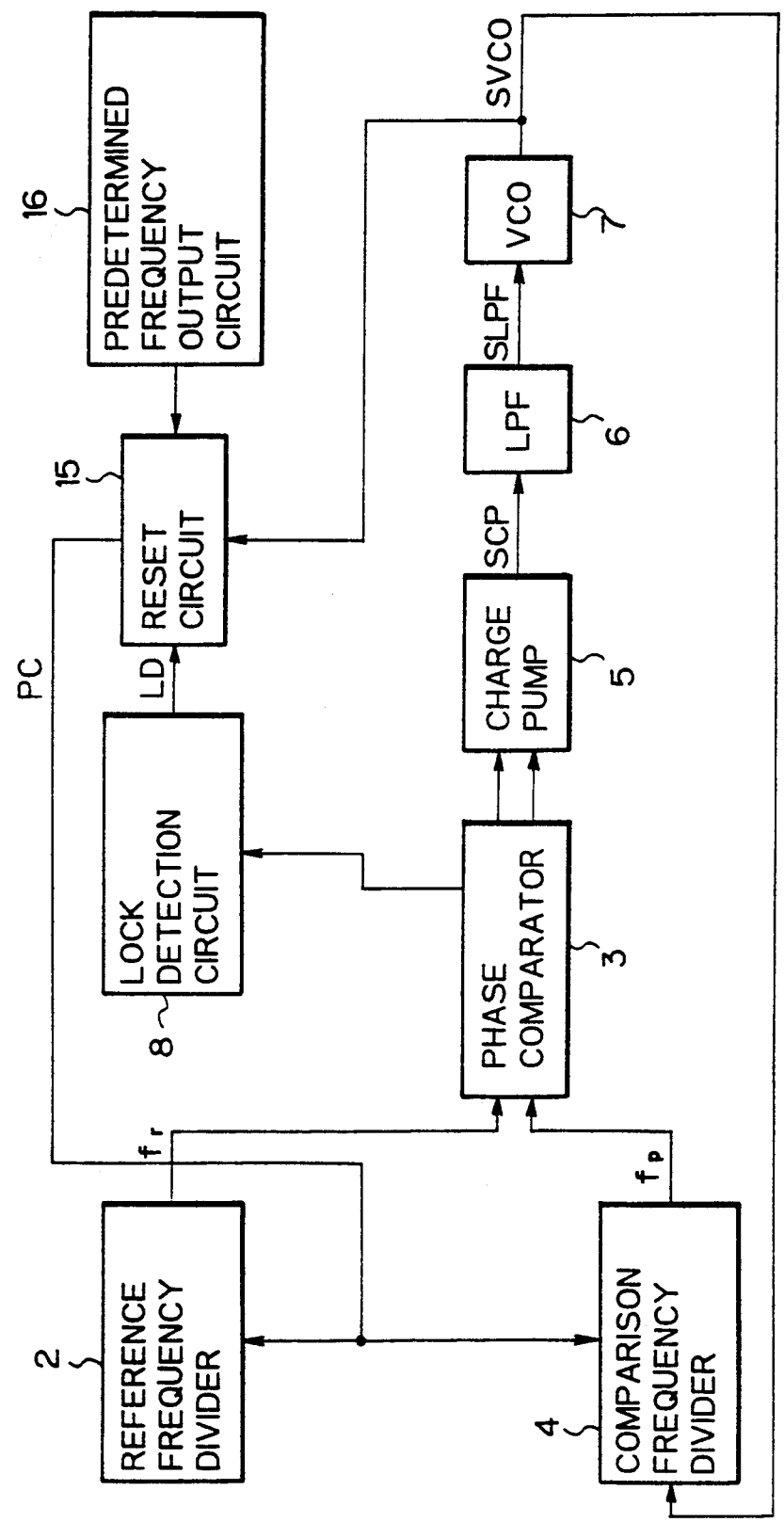
FIG. 1 is a block diagram explaining the principle of the present invention.

As described above, the fundamental technical structure of the PLL synthesizer circuit according to the present invention is shown in FIG. 1, and as a result, in the PLL synthesizer circuit of the present invention, when the frequency of the output signal SVCO of the voltage controlled oscillator 7 coincides with or approaches the set frequency when the lock detection circuit 8 does not output the lock signal LD, the reset circuit 15 outputs the reset signal to the reference frequency divider 2 and to the comparison frequency divider 4 so that the phases of the reference signal fr and the comparison signal fp are aligned.

In the present invention, when the lock signal is output, i.e., in a locked condition, the reset signal is not output.

Even in the locked condition, there still is a chance that a frequency difference between a frequency of an output of the reference frequency divider 2 and a frequency of an output of the comparison frequency divider 4 will be generated.

In this situation, when the reset circuit 15 is simply provided between the phase comparator 3 and the voltage controlled oscillator 7, the reset circuit 15 outputs the reset signal PC when it detects the frequency difference between a frequency of an output of the reference frequency divider 2 and a frequency of an output of the comparison frequency divider 4.

In the present invention, however, since the lock detection circuit 8 is provided, the reset signal is not output from the reset circuit 15 under the lock condition and thus no such resetting operation is carried out under the lock condition to prevent noise caused by the phase difference from being applied to the output voltage output from the low-pass filter 6.

Note, that although the noise as mentioned above causes the oscillating frequency to be unstable due to further variation of the output frequency of the voltage controlled oscillator 7, this problem can be solved by utilizing the above mentioned technical construction of the present invention.

Further, in the present invention, even under the unlocked condition, the reset circuit 15 does not output the reset signal PC until when the output frequency coincides with or approaches to the set frequency whereby this fact makes the rising period of the output voltage of the low-pass filter 6 fast.

Namely, since the reset operation as mentioned above serves to coincide the output of the reference frequency divider 2 with the output of the comparison frequency divider 4, the resetting operation should be carried out at the moment when the phase difference between them is detected.

However, the phase difference between them has been generated before the time when the output frequency coincides with the predeterminedly set frequency, i.e., at the moment when the unlock condition is created, and therefore, even when the resetting operation has been carried out at that moment, the phase difference is naturally provided between both outputs exactly just after the time when the resetting operation was carried out, since a certain amount of the phase difference exists between both output signals due to the frequency difference formed therebetween.

Accordingly, further resetting operation should be required. The present invention, however, can easily overcome these problems and attain a rapid resetting operation whereby the frequency of the output signal rapidly coincides with the predetermined set frequency in that when the phase difference is generated, the resetting operation is not carried out until when the output frequency coincides with the set frequency to thereby prevent the raising up operation of the output signal voltage from being disturbed by the resetting operation. In another preferred embodiment of the present invention, the PLL synthesizer circuit as shown in FIG. 1 may include a predetermined set frequency output circuit 16.

The set frequency output circuit 16, in which the frequency thereof is predeterminedly set, outputs a set frequency to the reset circuit 15 and thus the reset circuit 15 can compare the output signal SVCO of the voltage controlled oscillator 7 with the set frequency to output the resetting signal PC when both of the frequencies are coincided with or approached to each other.

In another embodiment of the PLL synthesizer circuit according to the present invention, the reset circuit 15 described above is constituted by a frequency comparison circuit 9 that compares the frequency of the reference signal fr with that of the comparison signal fp, and outputs the reset signal PC, when the frequencies coincide with or approach to each other.

Figure 2:
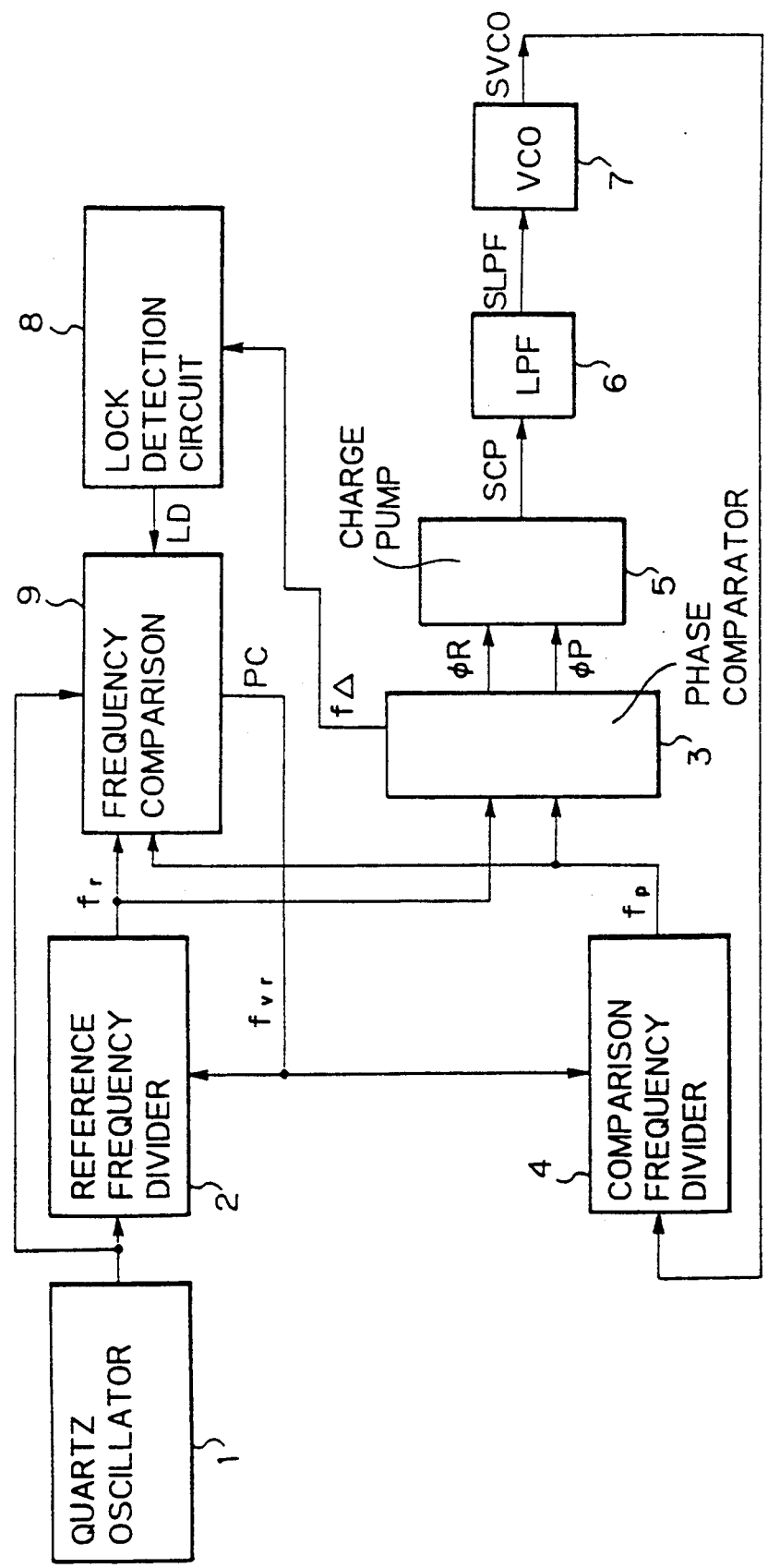
FIG. 2 is a block diagram showing a frequency comparison circuit in a first embodiment of the present invention.

In the embodiment shown in FIG. 2, the frequency of the reference signal fr is compared with that of the reference signal fp by the frequency comparison circuit 9, and when these frequencies coincide with each other, the reset signal PC is output to the reference frequency divider 2 and to the comparison frequency divider 4.

Figure 5:
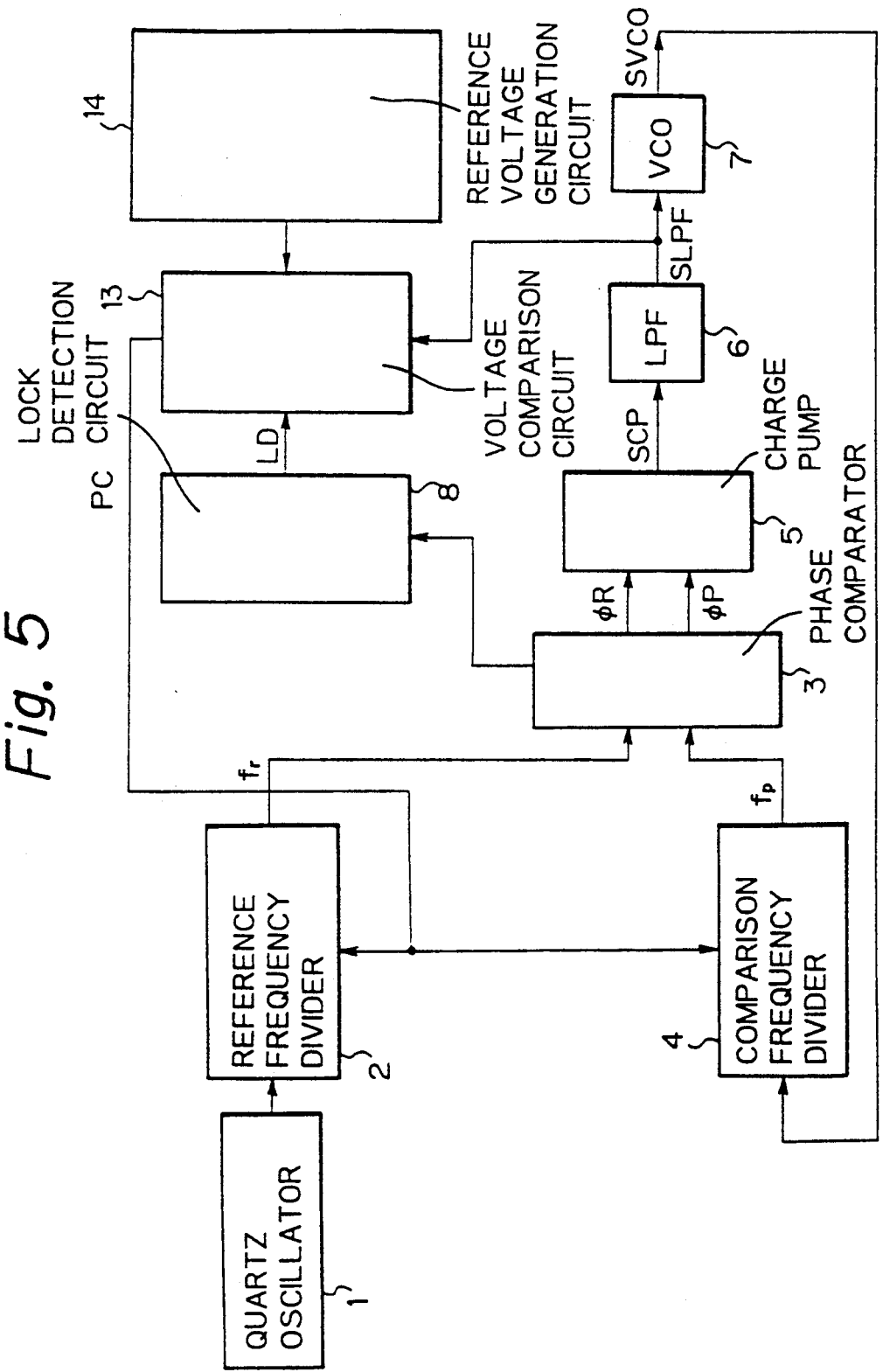
FIG. 5 is a block diagram showing a second embodiment of the present invention.
Figure 6:
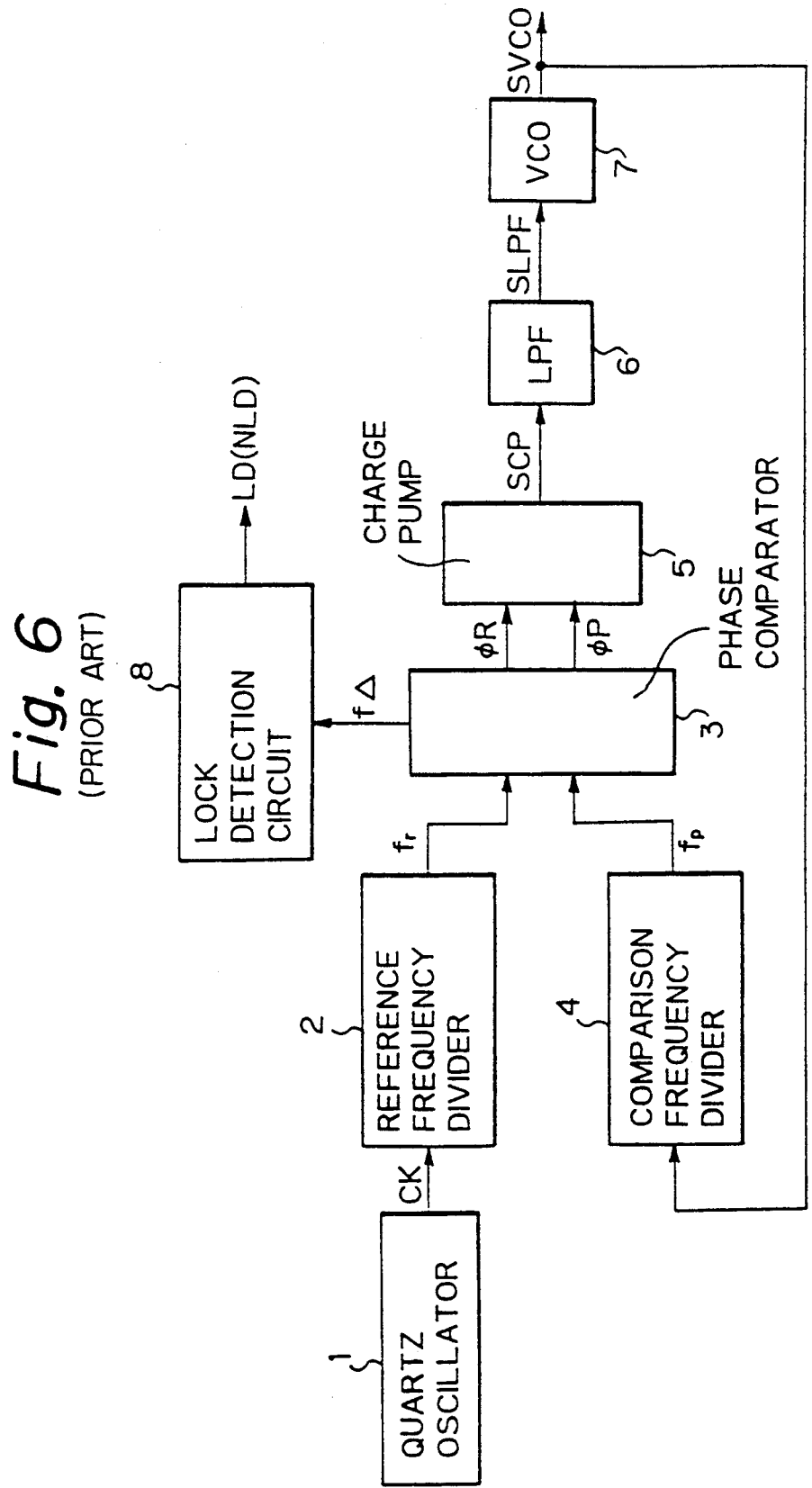
FIG. 6 is a block diagram showing a prior art example.
Figure 7:
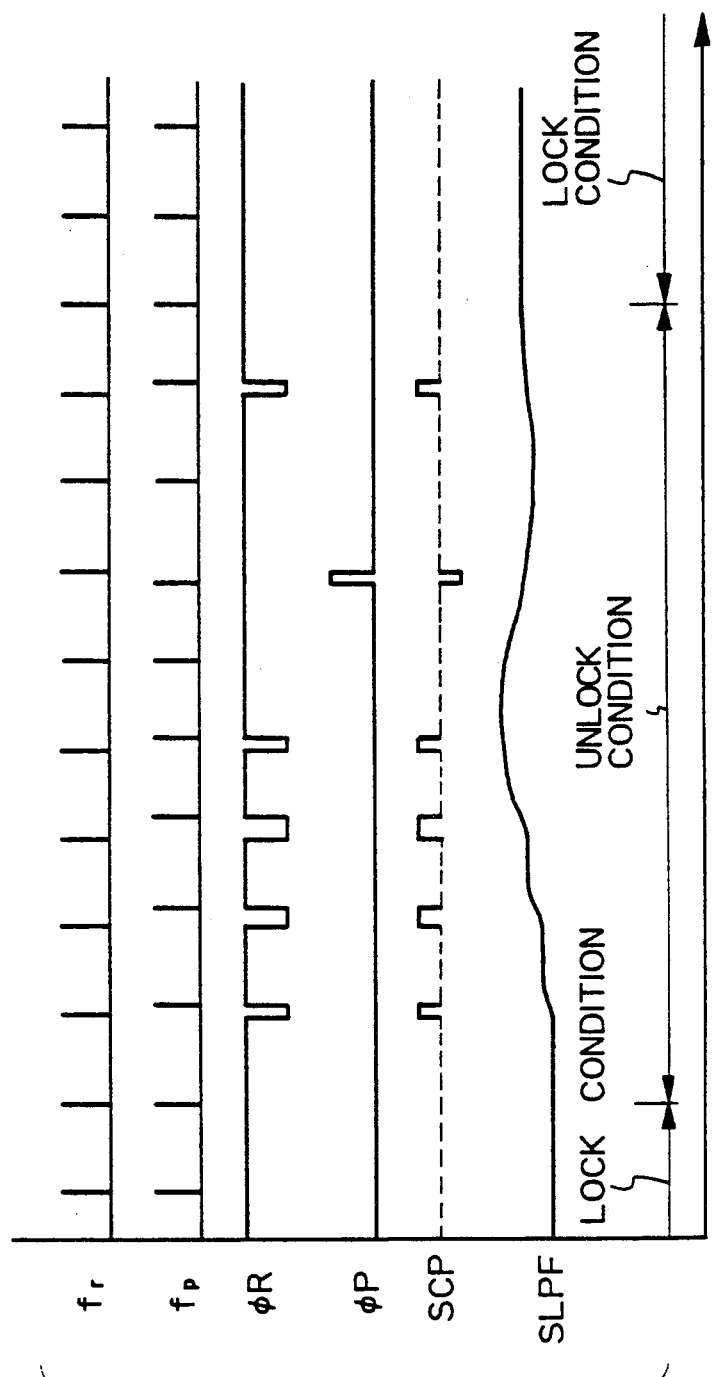
FIG. 7 is a waveform diagram showing the operation of the prior art example.

Still another embodiment of the PLL synthesizer circuit according to the present invention is shown in FIG. 5. As shown in the drawing, the reset circuit 15 is constituted by a voltage comparison circuit 13 that compares the output voltage SLPF of the low-pass filter 6 with a reference voltage which corresponds to a set frequency, and outputs the reset signal (PC), the output voltage SLPF and the reference voltage coincide with or approach to each other.

In the circuit construction shown in FIG. 5, the output voltage SLPF of the low-pass filter 6 is compared with the predetermined reference voltage by the voltage comparison circuit 13, and when they coincide, the reset signal PC is output to the reference frequency divider 2 and the comparison frequency divider 4.

The present invention will be explained in further detail with the following respective embodiments thereof.

The PLL synthesizer circuit of the embodiment shown in FIG. 2 is different from the prior art example only in that the frequency comparison circuit 9 is added to the prior art example. The clock signal CK, the reference signal fr output from the reference frequency divider 2, the comparison signal fp output from the comparison frequency divider 4 and the lock signal LD output from the lock detection circuit 8 are input to this frequency comparison circuit 9, and when the frequency of the reference signal fr coincides with the frequency of the comparison signal fp, when the lock signal LD is input, the frequency comparison circuit 9 outputs the output signal PC, which brings the phase of the reference signal fr into conformity with that of the comparison signal fp, to the reference frequency divider 2 and to the comparison frequency divider 4.

Figure 3:
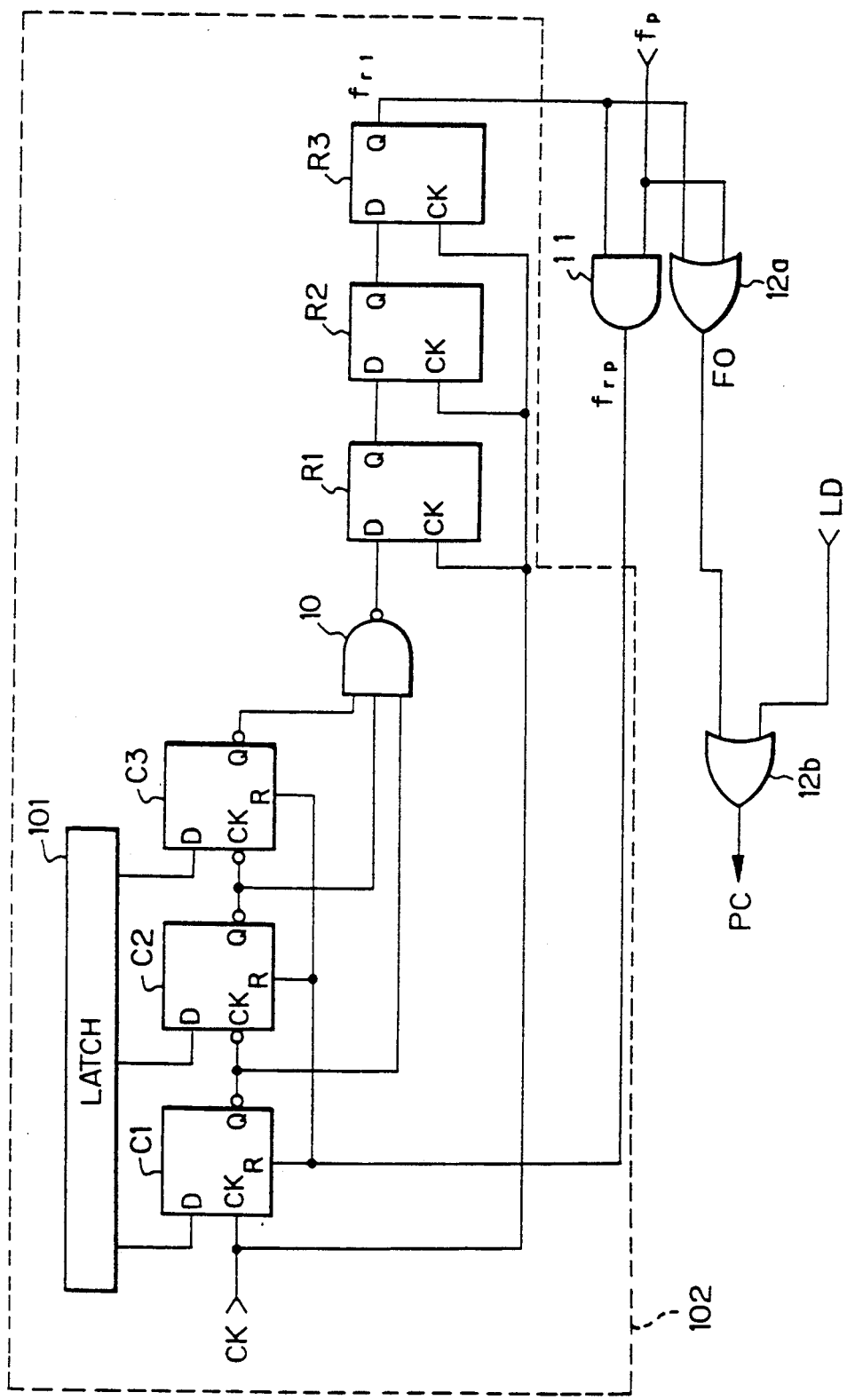
FIG. 3 is a circuit diagram showing a frequency comparison circuit of the first embodiment of the present invention.
Figure 4:
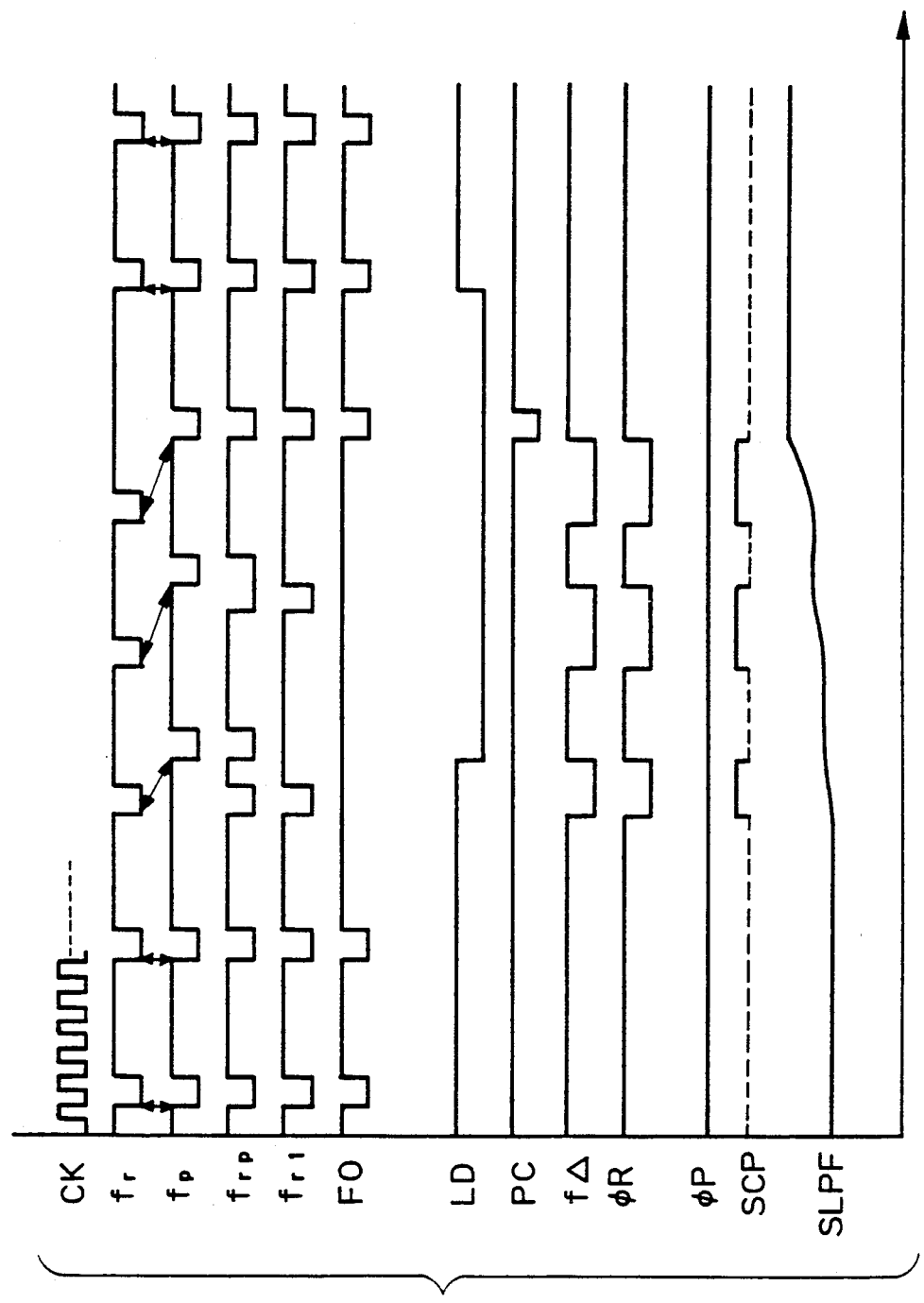
FIG. 4 is a waveform diagram showing the operation of the first embodiment.

The structure of the frequency comparison circuit 9 will be explained with reference to FIGS. 3 and 4. As shown in FIG. 3, the clock signal CK is input to the first stage of counter circuits C1-C3 having a three-stage structure, for example, and the output signal Q of each of these counter circuits C1-C3 is input to an NAND circuit 10. Input data on the basis of the reference signal fr are input from a latch circuit 101 to each counter circuit C1-C3, and the clock signal CK is frequency-divided and output by each counter C1-C3 and the NAND circuit 10 on the basis of the input data. The output signal of the NAND circuit 10 is output as an output signal fr1 through shift register circuits R1-R3 having a three-stage structure and operating on the basis of the clock signal CK, and this output signal fr1 is set so that it has the same frequency as the reference signal fr. Accordingly, the circuit consisting of these counter circuits C1-C3, NAND circuit 10 and shift register circuits R1-R3 has the same circuit structure as the reference frequency divider 2 described above.

The output signal fr1 and the comparison signal fp described above are input to an AND circuit 11 and to an OR circuit 12a, respectively, and an output signal frp having an L level of the AND circuit 11 is input as a reset signal R to the counter circuits C1-C3. The output signal FO of the OR circuit 12a is input to one of the input terminals of the OR circuit 12b, and the lock signal LD is input from the lock detection circuit 8 to the other input terminal. The output signal PC of the OR circuit 12b is output to the reference frequency divider 2 and to the comparison frequency divider 4, and the phases of the reference signal fr and comparison signal fp output from the reference frequency divider 2 and from the comparison frequency divider 4, on the basis of the L level output signal PC, respectively, are aligned.

As explained above, the circuitry 102 encircled by a dotted line as shown in FIG. 3 may be called a binary counter having a resetting function.

And therefore, the PLL synthesizer circuit of the present invention, as shown in FIG. 3, comprises the frequency comparison circuit which comprises a binary counter 102 having a resetting function, a first logic circuit 11, a second logic circuit 12a, and a third logic circuit 12b, wherein the binary counter receives an output signal of the first logic circuit 11 to which an output of said binary counter 102 and an output of said comparison frequency divider are input, and the second logic circuit 12a to which the output of the counter 102 and an output of the comparison frequency divider are input, outputting an output signal to one of input terminals of the third logic circuit 12b and the third logic circuit 12b receiving the output signal of the second logic circuit 12a at one of the input terminals thereof and the lock detection signal LD at another input terminal thereof and outputting the logical signal used as the resetting signal PC so that when the lock detection circuit detect the unlocked condition, the resetting circuit outputs the resetting signal when the reference frequency divider and the frequency of the comparison frequency divider coincide with or approach to each other.

Next, the operation of the PLL synthesizer circuit having the circuit construction described above will be explained with reference to FIG. 4.

When in a locked state such that the frequency of the output signal SVCO of the VCO 7 is substantially constant, the output signal LD of the lock detection circuit 8 is at the H level and in this state, the output signal PC of the frequency comparison circuit 9 is kept at the H level. When the set frequency is raised from this state and the differences in frequency and phase occur between the reference signal fr and the comparison signal fp, the pulse signal $\phi R$ is output from the phase comparator 3 and the pulse signal $f\Delta$, which is the same as the pulse signal $\phi R$, is output to the lock detection circuit 8. The lock detection circuit 8 discriminates that the pulse width of the pulse signal $\Delta f$ is above a predetermined value, and outputs the L level unlock signal LD.

The output signal SCP of the charge pump 5 changes on the basis of the pulse signal $\phi R$ from the phase comparator 3, the potential of the output signal SLPF of the LPF 6 rises and along with this rise, the frequency of the output signal SVCO of the VCO 7 rises and the frequency of the comparison signal fp output from the comparison frequency divider 4 rises.

At this time, the operations of the counter circuits C1-C3 are reset by the output signal frp of the AND circuit 11. Therefore, when the frequency of the output signal fr1 coincides with the frequency of the comparison signal fp, the output signal fr1 and the comparison signal fp fall to an L level in synchronism with each other. Then, the OR circuit 12a outputs the L level output signal FO, and the OR circuit 12b outputs the L level output signal PC, as the reset signal, to the reference frequency divider 2 and to the comparison frequency divider 4 on the basis of the output signal FO of the OR circuit 12a. The reference frequency divider 2 and the comparison frequency divider 4 operate on the basis of this output signal PC so as to align the phase of the reference signal fr and reference signal fp, and on the basis of these operations, the pulse components are eliminated from the output signals φR and φP of the phase comparator 3 and from fΔ; the lock detection circuit 8 outputs the H level lock signal LD, and the output signal PC of the frequency comparison circuit 9 reaches the H level and the frequency of the output signal SVCO of the VCO 7 becomes substantially constant.

Figure 8:
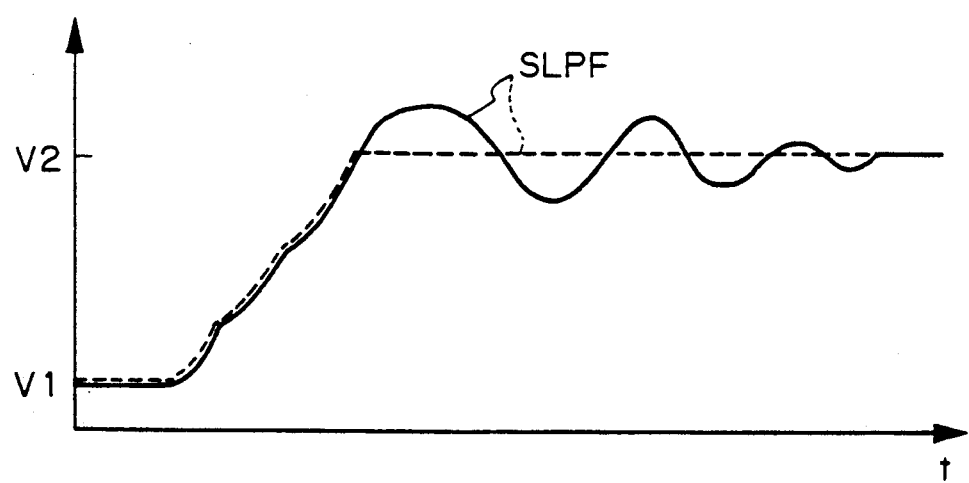
FIG. 8 is a waveform diagram showing an output signal of a low-pass filter.

Accordingly, when the frequency of the comparison signal fp is lowered in this PLL synthesizer circuit, the output signal SLPF of the LPF 6 is immediately fixed when it rises from V1 to V2 as represented by a dash line in FIG. 8, for example, and converges to V2 without repeating an over-shoot and under-shoot. As a result, the time necessary for the output signal SLPF to rise from V1 and to converge to V2 can be shortened without reducing the time constant of the LPF 6, and the lock-up time necessary for a change-over of the frequency of the output signal SVCO of the VCO 7 can be reduced.

Next, the second embodiment of the present invention will be explained with reference to FIG. 5. This embodiment is different from the first embodiment only in that the voltage comparison circuit 13 and the reference voltage generation circuit 14 are disposed in place of the frequency comparison circuit 9 of the first embodiment. A plurality of reference voltages corresponding to a plurality of frequencies to be changed over are set, in advance, to the reference voltage generation circuit 14, and any of them are selected and output to the voltage comparison circuit 13. The voltage comparison circuit 13 compares the voltage level of the output signal SLPF of the LPF 6 with the reference voltage output from the reference voltage generation circuit 14, and outputs the output signal PC, to align the phase of the reference signal fr with that of the comparison signal fp, to the reference frequency divider 2 and to the comparison frequency divider 4 when they coincide with each other.

When a setting of the reference signal fr is changed according to the circuit construction described above, the phases of both signals fr and fp can be brought into conformity with each other at the point of time when their frequencies coincide with each other, by outputting the reference voltage corresponding to this reference signal fr from the reference voltage generation circuit 14 to the voltage comparison circuit 13. Accordingly, the lock-up time can be shortened in the same way as in the first embodiment.

As described above in detail, the present invention provides an excellent effect in that the lock-up time can be shortened while sufficiently securing the time constant of the low-pass filter of the PLL synthesizer circuit.

What is claimed is:

1. A PLL synthesizer circuit of the type in which a reference signal (fr) output from a reference frequency divider (2) and a comparison signal (fp) output from a comparison frequency divider (4) are input to a phase comparator (3); said phase comparator (3) outputs output signals (φR, φP) having pulse widths thereof increasing or decreasing on the basis of the phase difference between both of said signals (fr, fp); said output signals (φR, φP) of said phase comparator (3) are converted to an analog voltage signal (SCP) by a charge pump (5), an output signal (SCP) of said charge pump (5) is output to a voltage controlled oscillator (7) through a low-pass filter (6), and an output signal (SVCO) of said voltage controlled oscillator (7) is output to said comparison frequency divider (4), so as to effect a negative feedback operation and bring the frequency and phase of said reference signal (fr) into conformity with the frequency and phase of said comparison signal (fp), and a lock detection circuit (8) connected to said phase comparator (3) does not output a lock signal (LD) when the pulse widths of said output signals (φR, φP) of said phase comparator (3) are above predetermined values but outputs said lock signal (LD) when the pulse widths are below the predetermined values;

characterized in that there is disposed a reset circuit (15) for outputting a reset signal (PC) when the frequency of said output signal (SVCO) of said voltage controlled oscillator (7) coincides with or approaches a set frequency when said lock detection circuit (8) does not output said lock signal (LD), and said reset signal (PC) is output to said reference frequency divider (2) and to said comparison frequency divider (4) so as to forcibly bring the phase of said reference signal (fr) into conformity with the phase of said comparison signal (fp).

2. A PLL synthesizer circuit according to claim 1, wherein said reset circuit comprises a frequency comparison circuit (9) that compares the frequency of said reference signal (fr) with the frequency of said comparison signal (fp), and outputs said reset signal (PC), when the frequency of said reference signal (fr) coincides with or approaches the frequency of said comparison signal (fp).

3. A PLL synthesizer circuit according to claim 1, wherein said reset circuit comprises a voltage comparison circuit (13) that compares the output voltage (SLPF) of said low-pass filter (6) with a predetermined reference voltage corresponding to said set frequency, and outputs said reset signal (PC) when the output voltage (SLPF) coincides with or approaches the frequency of said reference voltage.

4. A PLL synthesizer circuit according to claim 1, wherein said reset circuit is further provided with a set frequency output circuit.

5. A PLL synthesizer circuit according to claim 2, wherein said frequency comparison circuit comprises a binary counter 102 having a resetting function, a first logic circuit 11, a second logic circuit 12a, and a third logic circuit 12b, wherein said binary counter receives an output signal of said first logic circuit 11 to which an output of said binary counter 102 and an output of said comparison frequency divider are input, and said second logic circuit 12a to which the output of the counter 102 and an output of the comparison frequency divider are input, outputting an output signal to one of input terminals of said third logic circuit 12b and said third logic circuit 12b receiving the output signal of said second logic circuit 12a at one of the input terminals thereof and the lock detection signal LD at another input terminal thereof and outputting the logical signal used as the resetting signal PC so that when the lock detection circuit detect the unlocked condition, the resetting circuit outputs the resetting signal when the frequency of the reference signal and the frequency of the comparison signal coincide with or approach to each other.

* * * * *

UNITED STATES PATENT AND TRADEMARK OFFICE
CERTIFICATE OF CORRECTION

PATENT NO. : 5,304,954
DATED : April 19, 1994
INVENTOR(S) : Shinji SAITO et al.

It is certified that error appears in the above-indentified patent and that said Letters Patent is hereby corrected as shown below:

On the title page, item [54],
   IN THE TITLE, "CONTROL" should be --CIRCUIT--.

Col. 7, line 13, "dash" should be --dashed--;

Col. 8, line 62, "detect" should be --detects--.

Signed and Sealed this

Twenty-seventh Day of September, 1994

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,304,954
DATED : April 19, 1994
INVENTOR(S) : Shinji SAITO et al.

It is certified that error appears in the above-indentified patent and that said Letters Patent is hereby corrected as shown below:

On the Cover Page, under [73] Assignee, please change the Assignee to read

--FUJITSU LIMITED, Kawasaki, Japan; and
FUJITSU VSLI LIMITED, Kasugai, Japan--.

Signed and Sealed this

Fifteenth Day of August, 1995

Attest:

BRUCE LEHMAN

Attesting Officer

Commissioner of Patents and Trademarks